Oct. 17, 1967 J. F. KISTLER 3,348,159
AMPLIFIER HAVING POLARITY INSENSITIVE OUTPUT VOLTAGE
Filed Oct. 8, 1965
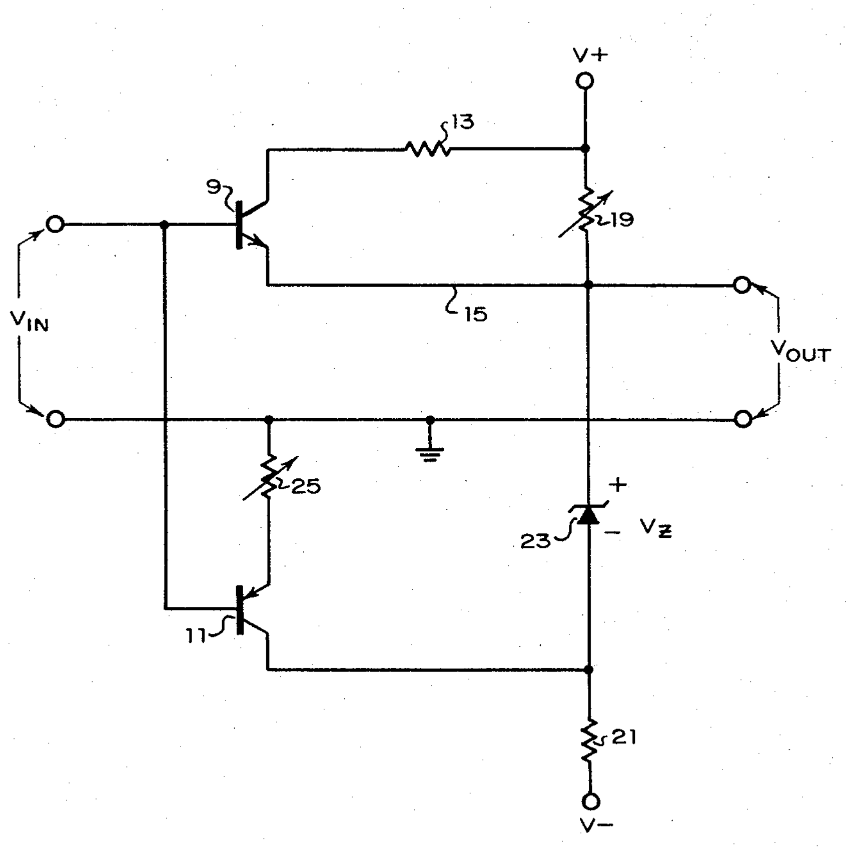
INVENTOR
JAMES F. KISTLER
BY Q. C. Smith
ATTORNEY 3,348,159
Patented Oct. 17, 1967

3,348,159

AMPLIFIER HAVING POLARITY INSENSITIVE OUTPUT VOLTAGE

James F. Kistler, Loveland, Colo., assignor to Hewlett-Packard Company, Palo Alto, Calif., a corporation of California Filed Oct. 8, 1965, Ser. No. 494,000
1 Claim. (Cl. 330—13)

This invention relates to electronic amplifiers and has for an object the provision of a circuit which amplifies an applied signal without regard for its polarity to produce an output of one polarity having an amplitude related to the absolute magnitude of the applied signal.

In one embodiment of the invention, illustrated in the accompanying drawing showing a schematic diagram of the invention, complementary conductivity transistors receive the applied signal and produce a related output signal on a common line with one transistor operating as an emitter follower and the other operating as a common emitter stage with gain degeneration.

In the drawing, the bases of transistors 9 and 11 receive the input signal $V_{in}$. The collector of transistor 9 is connected to the $V_+$ supply through resistor 13 and the emitter of transistor 9 is connected to the output line 15 and to the $V_+$ supply through resistor 19. The collector of transistor 11 is connected to $V_-$ supply through resistor 21 and to the output line 15 through Zener breakdown diode 23. The emitter of transistor 11 is connected to ground through resistor 25.

For zero $V_{in}$, $V_o$ is set to zero by adjusting resistor 19 to satisfy the equality:

$$\frac{(V_+)}{R_{19}}=\frac{(V_-)-(V_z)}{R_{21}} \qquad (1)$$

The values of resistor 13 and resistor 25 do not affect this adjustment since these resistors are not conducting current.

For positive $V_{in}$, transistor 9 conducts and transistor 11 is cut off causing $V_o$ to follow the input with the emitter follower gain of slightly less than unity. The value of $V_o$ is noted for the largest value of positive $V_{in}$ applied to the circuit.

For negative $V_{in}$, transistor 9 is cut off and transistor 11 conducts causing its collector to go positive with a gain determined by resistors 19, 21, and 25. With $V_{in}$ set to a negative value equal to the value of the largest positive $V_{in}$, resistor 25 is adjusted to set $V_o$ to a negative value equal to the magnitude of $V_o$ for the largest positive $V_{in}$ applied to the circuit. The following condition is thus established:

$$\frac{V_+-V_o}{R_{19}}=\frac{V_o+V_--V_z}{R_{21}}-\frac{V_{in}}{R_{25}} \qquad (2)$$

From Equation 1:

$$\frac{V_o}{V_{in}}=\frac{\frac{1}{R_{25}}}{\frac{1}{R_{21}}+\frac{1}{R_{19}}} \qquad (3)$$

The gain is thus set by resistor 25 where resistor 21 is fixed and resistor 19 is undisturbed. The conditions of Equation 1 are thus preserved following adjustment of resistor 25 so that $V_o$ is zero for zero $V_{in}$ and the gains for positive and negative $V_{in}$ are identical in magnitude with $V_o$ going positive for $V_{in}$ of either polarity.

I claim:

An amplifier circuit comprising:

a pair of complementary conductivity type transistors, each having base, emitter and collector electrodes;

an input terminal for receiving an applied signal with respect to a reference potential;

means connecting the base electrodes of said transistors to receive applied signal appearing at said input terminal;

a power supply having positive and negative output potentials with respect to said reference potential;

means connecting the collector of one transistor to one output of said supply;

a resistor connecting the collector of the other transistor to another output of said power supply;

an output terminal connected to the emitter of said one transistor;

a Zener diode connecting the output terminal to the collector of said other transistor;

a resistor connecting the emitter of said other transistor to said source of reference potential; and another resistor connecting said output terminal and said one output of said power supply.

References Cited

UNITED STATES PATENTS

| | | | |
|---|---|---|---|
| 3,135,872 | 6/1964 | Nichols | 307—88.5 |
| 3,244,996 | 4/1966 | Ott | 330—24 |

NATHAN KAUFMAN, *Acting Primary Examiner.*

ROY LAKE, *Examiner.*

L. J. DAHL, *Assistant Examiner.*